(12) United States Patent
Nistler et al.

(10) Patent No.: US 7,501,823 B2
(45) Date of Patent: Mar. 10, 2009

(54) CYLINDRICAL MAGNETIC RESONANCE ANTENNA

(75) Inventors: Juergen Nistler, Erlangen (DE); Wolfgang Renz, Erlangen (DE); Markus Vester, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 102 days.

(21) Appl. No.: 11/737,214

(22) Filed: Apr. 19, 2007

(65) Prior Publication Data

US 2007/0247158 A1 Oct. 25, 2007

(30) Foreign Application Priority Data

Apr. 19, 2006 (DE) .................. 10 2006 018 158

(51) Int. Cl.
*G01V 3/00* (2006.01)
(52) U.S. Cl. .................................... 324/318
(58) Field of Classification Search ......... 324/300–322; 600/410–435; 333/219–235; 343/718, 720, 343/841–842, 845–849, 872–873, 904–908
See application file for complete search history.

(56) References Cited

U.S. PATENT DOCUMENTS

| | | | | |
|---|---|---|---|---|
| 4,638,253 A | * | 1/1987 | Jaskolski et al. ............. 324/311 |
| 5,081,418 A | * | 1/1992 | Hayes et al. ................. 324/322 |
| 5,144,240 A | * | 9/1992 | Mehdizadeh et al. ........ 324/318 |
| 5,367,261 A | * | 11/1994 | Frederick ..................... 324/318 |
| 5,990,681 A | * | 11/1999 | Richard et al. ............... 324/318 |
| 6,020,740 A | * | 2/2000 | Renz et al. ................... 324/318 |
| 6,029,082 A | * | 2/2000 | Srinivasan et al. ........... 600/422 |
| 6,043,658 A | | 3/2000 | Leussler |
| 6,344,745 B1 | * | 2/2002 | Reisker et al. ............... 324/318 |
| 6,396,271 B1 | * | 5/2002 | Burl et al. .................... 324/318 |
| 6,429,656 B2 | * | 8/2002 | Domalski ..................... 324/318 |
| 6,522,143 B1 | * | 2/2003 | Fujita et al. .................. 324/318 |
| 6,661,229 B2 | * | 12/2003 | Weyers et al. ................ 324/318 |
| 6,831,460 B2 | * | 12/2004 | Reisker et al. ............... 324/318 |
| 6,943,551 B2 | | 9/2005 | Eberler et al. |
| 7,180,291 B2 | * | 2/2007 | Chmielewski et al. ....... 324/318 |
| 7,345,481 B2 | * | 3/2008 | Leussler ....................... 324/318 |
| 2002/0109503 A1 | | 8/2002 | Kestler et al. |
| 2004/0155656 A1 | | 8/2004 | Leussler |

\* cited by examiner

*Primary Examiner*—Dixomara Vargas
(74) *Attorney, Agent, or Firm*—Schiff Hardin LLP

(57) ABSTRACT

A cylindrical magnetic resonance antenna suitable for use as a local antenna for the reception or transmission of magnetic resonance signals, has an antenna arrangement, such as a birdcage antenna arrangement with longitudinal conductors connected at their opposite ends by end rings. In each case, two adjacent longitudinal conductors and the end ring segments therebetween form a network. In each case, the end ring segments connecting two of the adjacent longitudinal conductors are formed as end ring sections, with an end ring capacitance connected therebetween, which is the same for all of the end ring segments. A grounded screen externally encompasses the antenna arrangement. The grounded screen is composed of electrically conductive material and is coupled through a screen capacitance to the longitudinal conductors and the end rings. The longitudinal conductors are each formed by conductor sections connected with a longitudinal capacitance therebetween, which is the same for all of the longitudinal conductors. The longitudinal capacitance, the end ring capacitance, and the screen capacitance are dimensioned so that the magnetic resonance antenna always has the same resonance frequency regardless of the type of activation thereof.

16 Claims, 2 Drawing Sheets

CYLINDRICAL MAGNETIC RESONANCE ANTENNA

BACKGROUND OF THE INVENTION

1. Field of the Invention

The present invention relates to a cylindrical magnetic resonance antenna which is embodied as a local antenna and is used for the reception of signals and/or for field generation. The invention also relates to a magnetic resonance device in which an antenna of this type is integrated.

2. Description of the Prior Art

A magnetic resonance antenna is known that has a number of longitudinal conductors extending in a longitudinal direction of the magnetic resonance antenna and are arranged such that they are separated from each other and aligned in parallel with each other in the circumferential direction. Two end rings which connect the ends of the longitudinal conductors and proceed along the circumferential direction.

The longitudinal conductors are one or more longitudinal conductor sections that are arranged one behind the other in a longitudinal direction, with at least one longitudinal capacitance, this being essentially identical for each longitudinal conductor, being connected between two immediately consecutive longitudinal conductor sections and/or between at least one longitudinal conductor section adjacent to the end ring and the end ring.

Two adjacent longitudinal conductors and the end ring segments that connect them form a network in each case, and the end ring segments connecting two adjacent longitudinal conductors in each have at least two end ring sections, between which is connected at least one end ring capacitance, this being essentially identical for all end ring segments.

A magnetic resonance antenna of this type is known as a "birdcage antenna". In this context the two circular end rings are of coaxial design and are connected to each other by means of the longitudinal conductors, thereby suggesting the structure of a birdcage.

Such a magnetic resonance antenna has half as many different resonance frequencies as it has longitudinal conductors. A different resonance mode is assigned to each resonance frequency, the magnetic resonance antenna always being operated or controlled in that resonance mode in which a maximally homogeneous field distribution is produced within the antenna if the antenna is operated as a transmit antenna, or a location-independent constant sensitivity is present in the case of operation as a receive antenna.

In the case of such a magnetic resonance antenna, the homogeneity in its interior is usually calculated without further interfering elements. The homogeneity is disrupted, for example, as soon as a patient or part of a patient is situated within the magnetic resonance antenna. A possibility for correcting the homogeneity is therefore desirable. Furthermore, a number of location-dependent operating methods are known for magnetic resonance antennas. RX-Sense and TX-Sense are examples. In the case of RX-Sense, measurements are locally dispersed, with the location information of the magnetic resonance antenna being taken into consideration as well as the location information which is obtained from the gradient fields. In the case of TX-Sense, only a specific target region such as e.g. the heart must be stimulated. However, such methods require the provision of partial antennas of a magnetic resonance antenna which are able to be activated or read out independently in order to obtain the location information or transmit the location coding.

DE 197 02 256 A1 discloses a birdcage magnetic resonance antenna by means of which it is possible to improve the signal-to-noise ratio, i.e. a magnetic resonance antenna for receiving signals. To this end, it provides for the longitudinal capacitances and the end ring capacitances to be dimensioned such that the magnetic resonance antenna has only one single resonance frequency for all resonance modes. Consequently, the individual networks which form the magnetic resonance antenna are decoupled from each other such that the signals received from the individual networks can be processed independently to form magnetic resonance images which can be reassembled subsequently. However, this magnetic resonance antenna has the serious disadvantage that influences on the environment, e.g. adjacent gradient coils and their screening, can influence the arrangement such that no further matching resonance frequencies are present or the reception quality suffers considerably.

An arrangement for generating high-frequency fields in the examination volume of a magnetic resonance device is disclosed in DE 101 24 465 A1. This document also discloses a whole-body coil in the form of a birdcage coil. It is also proposed that the conductor elements of the whole-body coil be arranged at a small distance from the high-frequency screen of the magnetic resonance device, since this improves the decoupling characteristics of the whole-body coil.

SUMMARY OF THE INVENTION

An object of the present invention is to provide a local magnetic resonance antenna based on the birdcage structure, which includes partial antennas which can be activated or read out individually while maximizing insensitivity to environmental influences.

This object is achieved in accordance with the invention by a magnetic resonance antenna of the type described in the introduction, in which an exterior encompassing grounded screen of electrically conductive material is provided, the screen being coupled by a screen capacitance to the longitudinal conductors and the end rings, with the longitudinal capacitance, the end ring capacitance and the screen capacitance being configured such that the magnetic resonance antenna always has the same resonance frequency regardless of the type of activation.

The cylindrical magnetic resonance antenna according to the present invention therefore has, as an integral component, an externally encompassing, and therefore shielding, high-frequency screen that encompasses the antenna conductors at least completely from an axial perspective, i.e. the screen extends laterally at least as far as the end rings or beyond. Because the screen is electrically conductive and grounded, there is already a parasitic capacitive coupling to the end rings and the longitudinal conductors which are also electrically conductive in each case. This parasitic capacitive coupling and possibly further capacitances that are connected between the screen and the longitudinal conductors or the end rings are collectively referred to as "screen capacitance".

The longitudinal capacitance, the end ring capacitance and the screen capacitance are accordingly configured such that the magnetic resonance antenna only has one resonance frequency. It should be noted here that although a number of longitudinal capacitances and end ring capacitances are present, these nonetheless have the same value in each case. It is therefore only necessary to adapt this one amount, and this is what is meant by configuring the longitudinal capacitance and the end ring capacitance. The screen capacitance, which is formed by the screen as an integral component of the antenna with the longitudinal conductors and the end rings, is considered as a parameter from the outset when configuring the antenna. If, by virtue of suitably configuring the aforementioned capacitances, the resonance frequencies of the different modes for the activation of the magnetic resonance antenna are so close that they are no longer distinguishable during normal operating procedures of a magnetic resonance device, it can be said that the magnetic resonance antenna has only one resonance frequency. Consequently, it is sufficient for the function of the inventive magnetic resonance antenna if the resonance frequencies essentially correspond, i.e. if they can no longer be distinguished by the normal procedures in a magnetic resonance device.

Because the resonance frequencies of all modes coincide in a single resonance frequency, decoupling of the individual networks of the magnetic resonance antenna is achieved. These can then advantageously be activated and/or read out separately and without affecting each other, e.g. for field homogenization in the target region and/or in the case of the RX-Sense and TX-Sense methods. This allows a multiplicity of new operating possibilities.

The high-frequency screen which is integrated in the magnetic resonance antenna essentially performs two tasks. It firstly plays a part in the tuning of the resonance frequencies because the screen capacitance is taken into consideration, and it secondly screens the antenna effectively against environmental influences. Overall, a system is therefore provided which is optimally configured in terms of independent activation of the individual networks as partial antennas, while the arrangement is also independent relative to environmental influences which could change this configuration or reduce the quality of the antenna action.

A further advantage of the inventive magnetic resonance antenna is that it is also suitable for the previously known use of birdcage antennas without the need for further adaptation. Use in the basic mode alone is still possible, whereby there is no difference over previous configurations. Using a corresponding incoming supply, the field distribution of the different modes can be stimulated at the operating frequency. Consequently, the magnetic resonance antenna can be integrated in existing magnetic resonance systems without modification.

In addition, the inventive magnetic resonance antenna has a number of further advantages. The proximity of the longitudinal conductors and the end rings to the screen restricts the inductances which can influence the behavior of the antenna. Methods such as RX-Sense and TX-Sense are accelerated as a result of being able to activate or read out networks independently.

The magnetic resonance antenna according to the invention is a local antenna. It can be used either as part of a magnetic resonance device or as a standalone element which is only used when required. The local antenna is therefore insensitive due to the screening by the screen, and its individual networks can be activated or read out separately.

As previously mentioned, it is possible to determine the screen capacitance solely on the basis of parasitic capacitances. In this case, it is determined principally by the distance of the screen from the longitudinal conductors or the end rings.

It can also be effective for the screen capacitance to be determined from parasitic capacitances and a switch capacitance, which is connected into the screen with the connection conductors connecting the longitudinal conductors and/or the end rings. This variant therefore provides for additional conductive connections, the connection conductors, between the screen and the longitudinal conductors or the end rings, a switch capacitance which contributes to the screen capacitance being switched into each of said conductive connections. The connection conductors can extend e.g. in each case between a corner point of a network and an adjacent point at the screen, with the connection conductors being attached on one and/or both end rings. Alternatively, it can be effective for the connection conductors to extend between another point on the end ring, i.e. not the corner point of a network, and an adjacent point on the screen. Depending on the configuration and requirements, therefore, it is also possible to adapt the screen capacitance such that the resonance frequencies are sufficiently close to each other or coincide. A further possibility for adapting the screen capacitance is the addition of materials whose relative permittivity is greater than 1. In this case the chassis carrying the antenna parts or the spacers distancing the screen could be considered. It is likewise possible to fill the intermediate space between screen and end rings/longitudinal conductors (or a chassis carrying these) wholly or partially with such a material.

Incoming supply points or readout points, i.e. external interfaces, can be provided for activating or reading out the individual isolated networks. These external interfaces of the magnetic resonance antenna can be provided at the end ring segments of at least one end ring, on both sides of the end ring capacitance in each case. There are therefore as many interfaces as there are networks, or twice as many if the interfaces are provided on both sides. In this case it may be necessary to wire a common-mode choke, which is also known as a sheath wave trap, on the line side or the load side of the interfaces.

In a further variant, external interfaces of the magnetic resonance antenna can be provided for each network at a point on the end ring segment and adjacent points at the screen. If connection conductors with switch capacitances are already provided there, the interfaces can also be provided here on both sides of the switch capacitance. Such a connection conductor is not required for such an activation, however, since a capacitance between the point on the end ring and the adjacent point at the screen is parasitic in any case. The activation then takes place directly at the point on the end ring and the screen.

In a further embodiment of the magnetic resonance antenna, a number of longitudinal capacitances connected in series can be provided at a longitudinal conductor. The electrical fields in relation to the patient are advantageously reduced thereby.

The distance of the screen from the end rings and the longitudinal conductors is advantageously less than half the radius of the end ring.

If larger distances between screen and end ring are selected, the capacitive coupling between screen and the rest of the antenna is particularly small.

In a particularly advantageous embodiment, switch elements, particularly diodes, can be provided in the longitudinal conductors and/or end ring segments. With these switch elements, a network and/or the magnetic resonance antenna can be deactivated. As a result of providing such switch elements it is possible either to detune the antenna or even to shut down the antenna by switching off all 9 networks, e.g. if it is necessary to use a different antenna, in particular a different or additional local coil, whose operation must not be disrupted.

The magnetic resonance antenna should have at least four networks and can have e.g. eight networks in this case. Four resonance frequencies must then be merged into a single resonance frequency.

The longitudinal conductors and the end rings can advantageously consist of copper strips. As a result, the inductance of the individual conductor elements is reduced and the isolation of the adjacent networks is improved. The width of end rings and longitudinal conductors can vary according to the application scenario in this case.

The invention also relates to a magnetic resonance device with an integrated cylindrical magnetic resonance antenna according to the present invention. In this case the magnetic resonance antenna is embodied as a local antenna, while individual networks can nonetheless be activated or read out separately and the antenna represents a system which is practically insensitive to environmental influences by virtue of the integrated screen.

DESCRIPTION OF THE PREFERRED EMBODIMENTS

Figure 1:
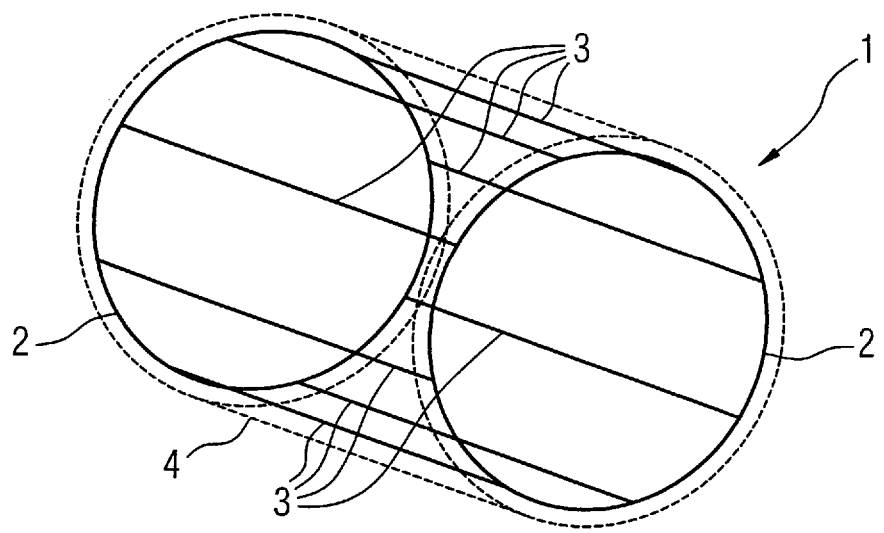
FIG. 1 is a schematic diagram of an inventive magnetic resonance antenna.

FIG. 1 shows an inventive magnetic resonance antenna 1 embodied as a local antenna. It is constructed in a cylindrical manner and consists on one hand of two coaxially arranged end rings 2 which are connected by eight parallel longitudinal conductors 3 at their ends. The end rings 2 and the longitudinal conductors 3 consist of copper strips in each case. These are fixed onto e.g. a chassis which is not shown in greater detail here. The birdcage that is formed from the longitudinal conductors 3 and the end rings 2 is surrounded by a metal (e.g. also copper) screen 4 which is illustrated here by means of a broken line in order to show the structure of the antenna more clearly. The desired distance between the birdcage structure and the screen 4 can be achieved e.g. by means of spacers which are fixed onto the chassis and are not shown in further detail here. The chassis and the spacers preferably consist of a low-loss material which is not electrically conductive.

Figure 2:
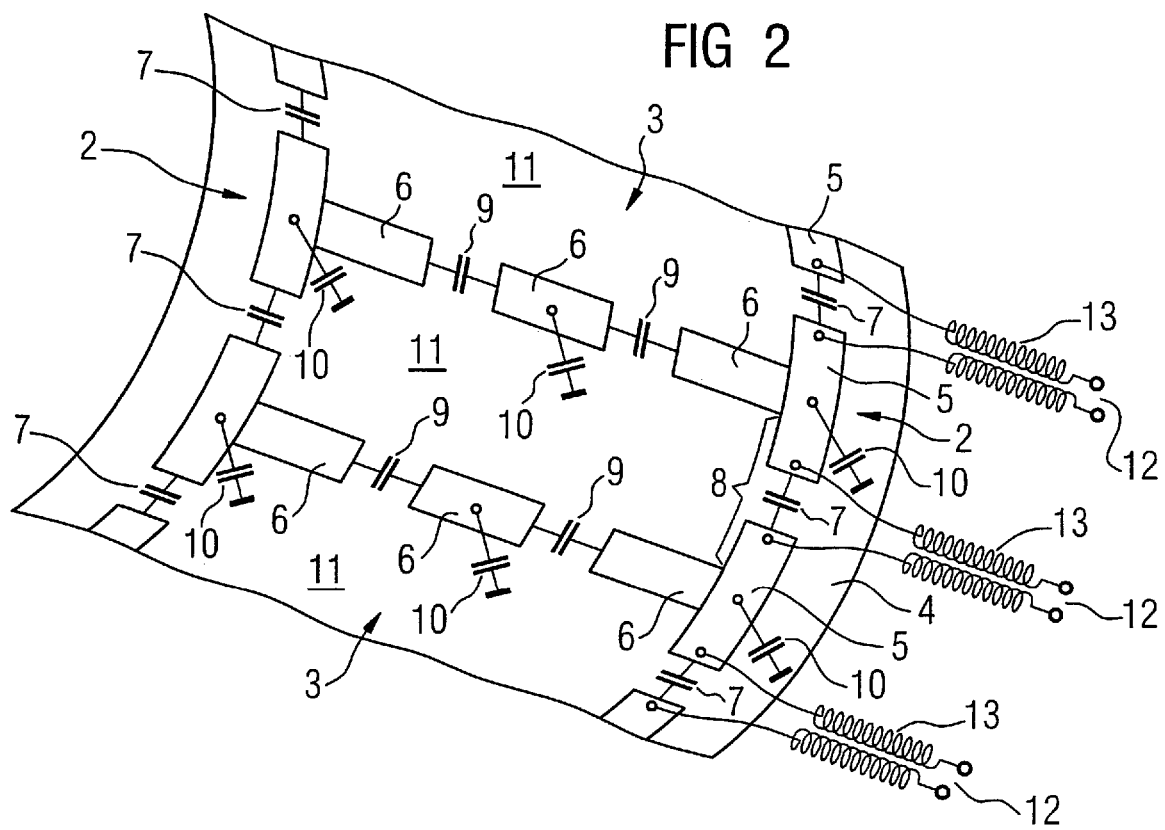
FIG. 2 is a partial view of the inventive magnetic resonance antenna according to a first exemplary embodiment, schematically illustrating the circuitry.

As a combination of schematic diagram and circuit diagram, FIG. 2 now shows a partial view of the magnetic resonance antenna 1 in a first embodiment. The end rings 2 are composed of end ring sections 5 in each case. A longitudinal conductor 3 is attached to each end ring section 5. The longitudinal conductors 3 in turn are composed of longitudinal conductor sections 6. Within this concept, the sections 5 and 6 are embodied as thin copper strips in each case.

The end ring sections 5 are connected via the same end ring capacitance 7 in each case. The end ring segments 8 connecting two longitudinal conductors 3 include only one end ring capacitance 7 in this case, though it is also conceivable to provide a larger number of end ring sections 5, an end ring capacitance 7 being interconnected between them in each case.

The longitudinal conductor sections 6 are connected via longitudinal capacitances 9. In this case, three longitudinal conductor sections 6 and two longitudinal capacitances 9 are provided per longitudinal conductor. While the end ring capacitances 7 and the longitudinal capacitances 9 are discrete switch elements in each case, the screen capacitances between the end rings 2 or the longitudinal conductors 3 and the screen 4 are each parasitic capacitances 10 in this case and are shown as equivalent circuit symbols. Their size is determined from the actual geometric embodiment of the magnetic resonance antenna 1.

In this case, the end ring capacitance 7, the longitudinal capacitance 9 and the parasitic capacitances 10 forming the screen capacitance are configured such that the resonance frequencies—there are in principle four resonance frequencies in the magnetic resonance antenna 1, since eight longitudinal conductors 3 are provided—coincide to form a single resonance frequency. The networks 11, which are formed in each case from two longitudinal conductors 3 and the associated connecting end ring segments 8, are isolated from each other and can be operated as partial antennas. External interfaces 12 are provided at one of the end rings 2 for the purpose of separate activation or readout of the networks 11. In this embodiment, the external interfaces 12 are in each case provided at the opposite ends of the end ring capacitance 7. Also in this embodiment, a sheath wave trap 13 is in each case connected on the line side or load side.

Figure 3:
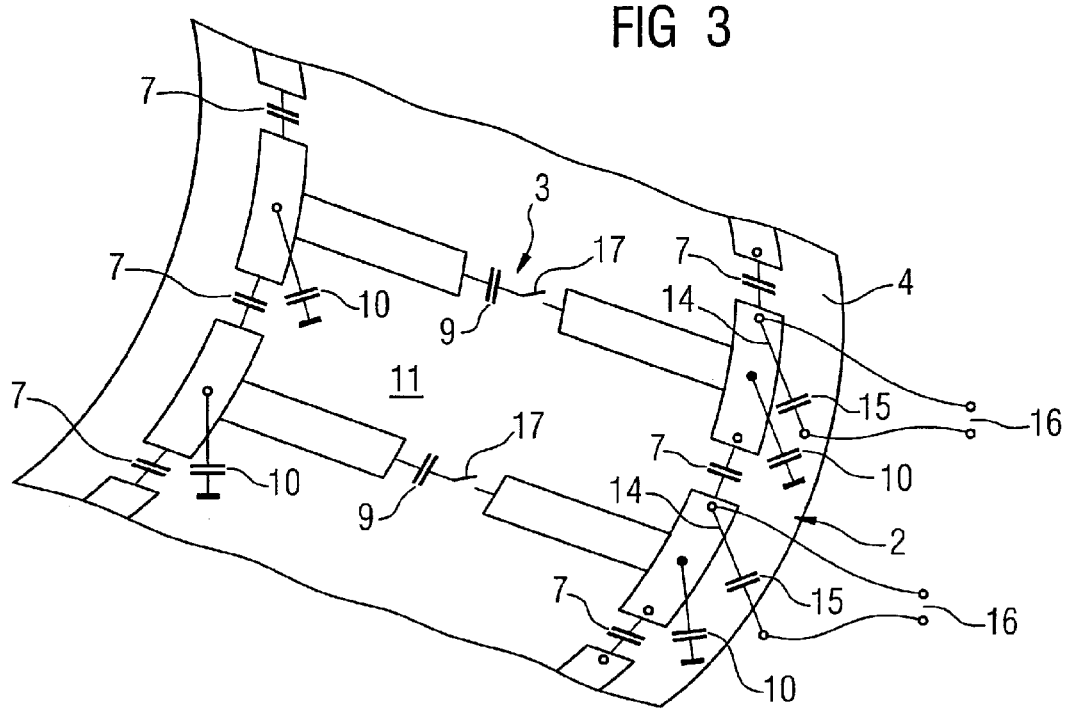
FIG. 3 is a partial view of a magnetic resonance antenna according to a second exemplary embodiment, showing a schematic representation of switch elements.

FIG. 3 shows a partial view, corresponding to that in FIG. 2, of a magnetic resonance antenna 1 according to a second exemplary embodiment. Unlike the first exemplary embodiment, the longitudinal conductors 3 are formed of only two longitudinal conductor sections 6, between which the longitudinal capacitance 9 is connected in each case. The end ring sections 5 of the end rings 2 are again connected by means of an end ring capacitance 7. In addition to the parasitic capacitances 10, however, provision is made here for a conductive connection 14 between a point on the end ring segments 8 and an adjacent point at the screen 4, wherein the same switch capacitance 15 is switched into said conductive connection in each case. The screen capacitance is therefore composed of the parasitic capacitance 10 and the switch capacitance 15. In contrast with the previous exemplary embodiment, the external interfaces 16 here are not provided at the two sides of the end ring capacitance 7, but at the two sides of the switch capacitance 15. Here again, the screen capacitance, i.e. the parasitic capacitances 10 and the switch capacitance 15, the end ring capacitance 7 and the longitudinal capacitance 9 are configured such that all four resonance frequencies converge, and therefore the individual networks 11 can be activated or read out independently.

Also in contrast with the first exemplary embodiment, a switch element 17 is provided at each of the longitudinal conductors 3, allowing the antenna to be detuned or deactivated completely by opening all switch elements 17. The switch elements 17 can be embodied as diodes, for example, with the antenna being disabled when a reverse voltage is applied.

Figure 4:
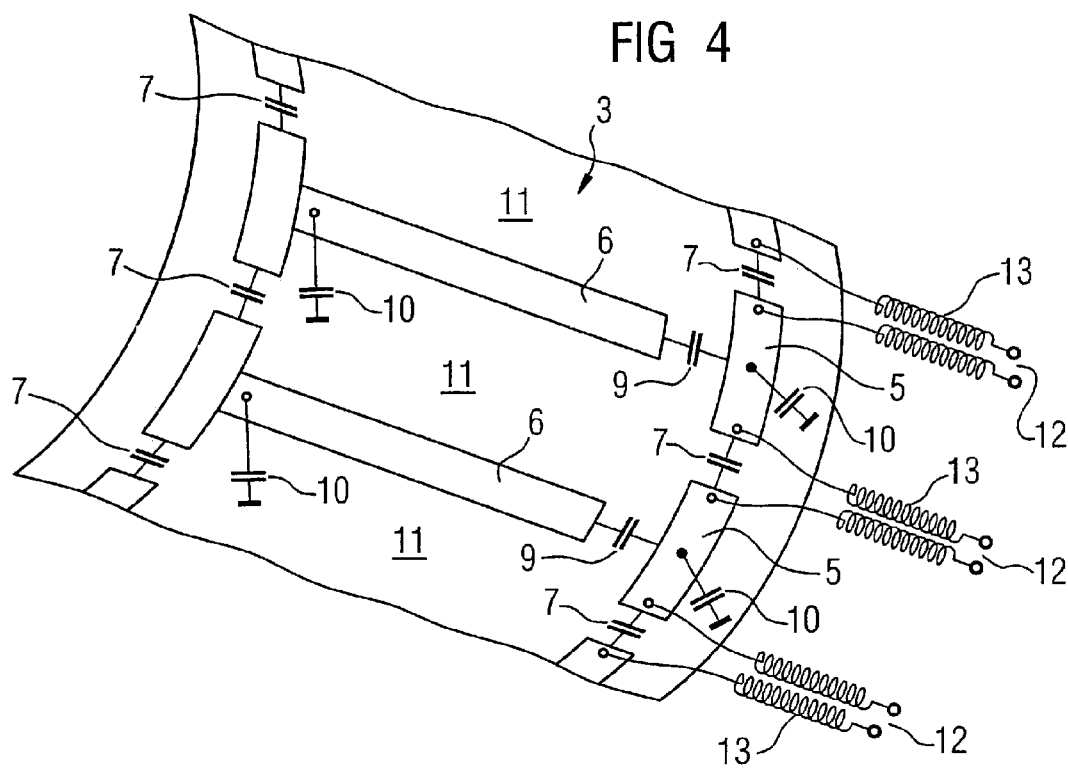
FIG. 4 is a partial view of a magnetic resonance antenna according to a third exemplary embodiment, showing a schematic representation of switch elements.

A further, third exemplary embodiment of a magnetic resonance antenna 1 is illustrated in FIG. 4. In this case the longitudinal conductors 3 only include one longitudinal conductor section 6. The longitudinal capacitance 9 here is connected between the end ring sections 5 and the adjacent end of the longitudinal conductor sections 6, but only on a single side, i.e. in the direction of one end ring. Clearly, it would also be possible to provide a longitudinal capacitance 9 on both sides. Moreover, an embodiment would be conceivable wherein a plurality of longitudinal conductor sections 6 are provided, a longitudinal capacitance 9 in each case being connected between the longitudinal conductor sections 6 as in FIGS. 2 and 3 and a longitudinal capacitance 9 being provided between the outer longitudinal conductor sections 6 and one or both end rings 2.

The magnetic resonance antenna 1 in the three exemplary embodiments is a local antenna in this case.

In this case the local antenna can have an inner diameter, i.e. a diameter of the end rings 2, of 28 cm. The diameter of the screen 4 is then 30 cm, and therefore the distance between the screen 4 and the end rings 2 or the longitudinal conductors 3 is 1 cm. In this exemplary embodiment, the width of the longitudinal conductors is 1.2 cm and the length of the longitudinal conductors 3 is 23 cm. The end rings 2 are likewise 1.2 cm wide. If no switch capacitance 15 is provided, a value of approximately 15 pF is appropriate for the longitudinal capacitance 9 and a value of approximately 30 pF is appropriate for the end ring capacitance 7.

Although modifications and changes may be suggested by those skilled in the art, it is the intention of the inventors to embody within the patent warranted hereon all changes and modifications as reasonably and properly come within the scope of their contribution to the art.

We claim as our invention:

1. A cylindrical magnetic resonance antenna for transmission or reception of radio-frequency signals, comprising:
    a plurality of longitudinal conductors extending in a longitudinal antenna direction and being parallel to and separated from each other in a circumferential antenna direction;
    two end rings respectively disposed at opposite ends of said plurality of longitudinal conductors, connecting the respective ends of the longitudinal conductors and proceeding around said circumferential antenna direction;
    each of said longitudinal conductors comprising at least one longitudinal conductor section proceeding in said longitudinal antenna direction with at least one longitudinal capacitance, identical for each longitudinal conductor, connected between two consecutive longitudinal conductor sections or between a longitudinal conductor section adjacent to the end ring and the end ring;
    each two circumferentially adjacent longitudinal conductors, and segments of the respective end rings connecting them, forming a network, each end ring segment comprising at least two end ring sections with at least one end ring capacitance connected therebetween, that is identical for all end ring segments; and
    a grounded screen comprised of electrically conductive material externally encompassing said plurality of longitudinal conductors, said screen being coupled through a screen capacitance to said longitudinal conductors and said end rings, said longitudinal capacitance, said end ring capacitance, and said screen capacitance being dimensioned to cause said magnetic resonance antenna to have the same resonance frequency for all types of activation thereof.

2. A magnetic resonance antenna as claimed in claim 1 wherein said screen capacitance comprises parasitic capacitances.

3. A magnetic resonance antenna as claimed in claim 1 wherein said screen capacitance comprises parasitic capacitances and a switch capacitance that is connected into the screen with connection conductors connecting at least one of the longitudinal conductors and the end rings.

4. A magnetic resonance antenna as claimed in claim 3 wherein said connection conductors each extend between a corner point of a network or a point on the end ring segment of a network, and an adjacent point at the screen, said connection conductors being attached on at least one of said end rings.

5. A magnetic resonance antenna as claimed in claim 1 comprising a material disposed between the screen and the end rings and the longitudinal conductors that adjusts the screen capacitance, said material having a relative permittivity greater than 1.

6. A magnetic resonance antenna as claimed in claim 1 comprising external interfaces at the respective end ring segments of at least one of said end rings on both sides of the end ring capacitance at said at least one of said end rings.

7. A magnetic resonance antenna as claimed in claim 6 wherein each of said interfaces has a line side and a load side, and comprising a plurality of sheath wave traps respectively connected to the interfaces at one of the line side or the load side thereof.

8. A magnetic resonance antenna as claimed in claim 1 comprising external interfaces for each network located at a point on the end ring segment of the network and adjacent points at the screen.

9. A magnetic resonance antenna as claimed in claim 1 comprising a plurality of longitudinal capacitances connected in series at at least one of said longitudinal conductors.

10. A magnetic resonance antenna as claimed in claim 1 wherein a distance of said screen from said end rings and the longitudinal conductors is less than half of a radius of the end rings.

11. A magnetic resonance antenna as claimed in claim 1 comprising switching elements connected in at least one of the longitudinal conductors and the end ring segments, said switch elements selectively deactivating the network in which the respective switch element is connected.

12. A magnetic resonance antenna as claimed in claim 11 wherein said switch elements are diodes.

13. A magnetic resonance antenna as claimed in claim 1 comprising at least four of said networks.

14. A magnetic resonance antenna as claimed in claim 1 comprising 8 of said networks.

15. A magnetic resonance antenna as claimed in claim 1 wherein each of said longitudinal conductors and said end rings is formed of a copper strip.

16. A magnetic resonance system comprising:
    a magnetic resonance data acquisition unit configured to interact with an examination subject to acquire magnetic resonance signals therefrom; and
    a cylindrical magnetic resonance antenna in said magnetic resonance data acquisition system, said cylindrical magnetic resonance antenna comprising a plurality of longitudinal conductors extending in a longitudinal antenna direction and being parallel to and separated from each other in a circumferential antenna direction; two end rings respectively disposed at opposite ends of said plurality of longitudinal conductors, connecting the respective ends of the longitudinal conductors and proceeding around said circumferential antenna direction; each of said longitudinal conductors comprising at least one longitudinal conductor section proceeding in said longitudinal antenna direction with at least one longitudinal capacitance, identical for each longitudinal conductor, connected between two consecutive longitudinal conductor sections or between a longitudinal conductor section adjacent to the end ring and the end ring; each two circumferentially adjacent longitudinal conductors, and segments of the respective end rings connecting them, forming a network, each end ring segment comprising at least two end ring sections with at least one end ring capacitance connected therebetween, that is identical for all end ring segments; and a grounded screen comprised of electrically conductive material externally encompassing said plurality of longitudinal conductors, said screen being coupled through a screen capacitance to said longitudinal conductors and said end rings, said longitudinal capacitance, said end ring capacitance, and said screen capacitance being dimensioned to cause said magnetic resonance antenna to have the same resonance frequency for all types of activation thereof.

* * * * *